United States Patent [19]
Louwagie et al.

[11] Patent Number: 5,582,525
[45] Date of Patent: Dec. 10, 1996

[54] DROP AND INSERT CARD

[75] Inventors: Dominic J. Louwagie, Eden Prairie; James D. Dewey, Plymouth; Daniel Rivera, Sr., St. Louis Park, all of Minn.

[73] Assignee: ADC Telecommunications, Inc., Minneapolis, Minn.

[21] Appl. No.: 372,050

[22] Filed: Jan. 12, 1995

[51] Int. Cl.$^6$ .................................. H01R 17/18
[52] U.S. Cl. .............................. 439/668; 439/188
[58] Field of Search ........................... 439/668, 669, 439/79, 59–65, 76, 180, 188; 200/51.1, 51.07, 51.08, 51.09

[56] References Cited

U.S. PATENT DOCUMENTS

| | | |
|---|---|---|
| 4,655,535 | 4/1987 | Kysiak . |
| 4,737,113 | 4/1988 | Hopper et al. . |
| 4,768,961 | 9/1988 | Lau . |
| 4,770,639 | 9/1988 | Lau . |
| 4,797,114 | 1/1989 | Lau .................................. 439/668 |
| 4,820,200 | 4/1989 | Lau .................................. 439/668 |

*Primary Examiner*—David L. Pirlot
*Attorney, Agent, or Firm*—Merchant, Gould, Smith, Edell, Welter & Schmidt

[57] ABSTRACT

A card is provided for insertion in a telecommunications chassis. The card includes two sets of ports each having tip and ring contacts. The normal springs of the first set are electrically connected to normal springs of the second set.

9 Claims, 7 Drawing Sheets

DROP AND INSERT CARD

I. BACKGROUND OF THE INVENTION

1. Field of the Invention

This invention pertains to the telecommunications industry. More particularly, this invention pertains to a card for use in providing access to a plurality of telecommunication lines.

2. Description of the Prior Art

In the telecommunications industry, cross-connecting and switching functions are common. Historically, the industry has utilized manually operated digital system cross-connect (DSX) apparatus for connecting two or more units of telecommunications equipment. The DSX equipment could provide cross-connect, monitor and other access functions in the network.

In recent years, the telecommunications industry has considered the implementation of electronic digital signal cross-connect (EDSX) equipment to replace conventional manual DSX equipment. When utilizing EDSX equipment, it is desirable to retain opportunities for manual cross-connect as well as test access and monitoring functions independent of the EDSX equipment.

U.S. Pat. No. 5,199,878 to Dewey et al. dated Apr. 6, 1993 entitled "Plug-In Jack Card For Normally Closed Contacts" teaches an apparatus which can permit a module to be inserted into a normally closed contact with the module permitting cross-connect as well as test access and monitoring functions. With the product as shown in the '878 patent, tip and ring lines of a twisted pair signal are terminated on the normally closed contacts of a chassis. Specifically, tip and ring lines from the network equipment and tip and ring lines from DCS equipment are terminated on wire wrap pins on the rear of a chassis. The lines are appropriately connected through normally closed contacts on the chassis. When access is desired, a module such as module 14 in the '878 patent can be inserted into the chassis. Insertion of the module maintains communication between the network and the DCS lines. However, insertion of a jack plug into forward ports of the module 14 permits access to the signal. For example, insertion of a plug into out-port 84 permits the out-signal of the network to be patched to a different piece of equipment. This effectively breaks communication of the out-signal between the network and the DCS. Similarly, the in-signal may be patched off by inserting a plug into the in-port 86 of the prior art module 14. Another alternative available with the prior art module 14 is to insert a plug into the monitor port 82 which permits the signal on the out-line to be monitored without interruption of the out-signal.

As shown in the '878 patent, the module 14 may be inserted into the chassis in any one of two orientations. In a first orientation, one set of equipment (for example, the network) is terminated and the other set of equipment (for example, the DCS equipment) can be monitored or accessed through the module 14. When the module 14 is inverted and plugs are inserted into ports 84,86, the opposite sets of equipment are terminated or accessible. Accordingly, with the prior art module of the '878 patent, a technician is able to access the signal in only one direction at a time. Also, so called "in-service patching" is not possible where it is desirable to move traffic from one module 14 to another module.

It is an object of the present invention to provide a module which overcomes the disadvantages of the prior art module.

II. SUMMARY OF THE INVENTION

According to a preferred embodiment of the present invention, a module is provided for insertion into the telecommunication chassis. The module includes a body member sized to be removably inserted into the chassis. A plurality of ports are provided on the front end of the body with each sized to receive a jack plug having a tip and ring contact surface. A plurality of exposed contacts are provided on the rear end of the body member. A plurality of spring contacts including tip and ring spring contacts and tip and ring normal contacts are disposed on the body member to engage the tip and ring contact surfaces of a jack plug inserted within either of the ports. The plurality of spring contacts includes first and second sets of such spring contacts associated with first and second sets of such ports. The normal contacts of the first set are in electrical communication with the normal contacts of the second set.

III. BRIEF DESCRIPTION OF THE DRAWINGS

IV. DESCRIPTION OF THE PREFERRED EMBODIMENT

Figure 1:
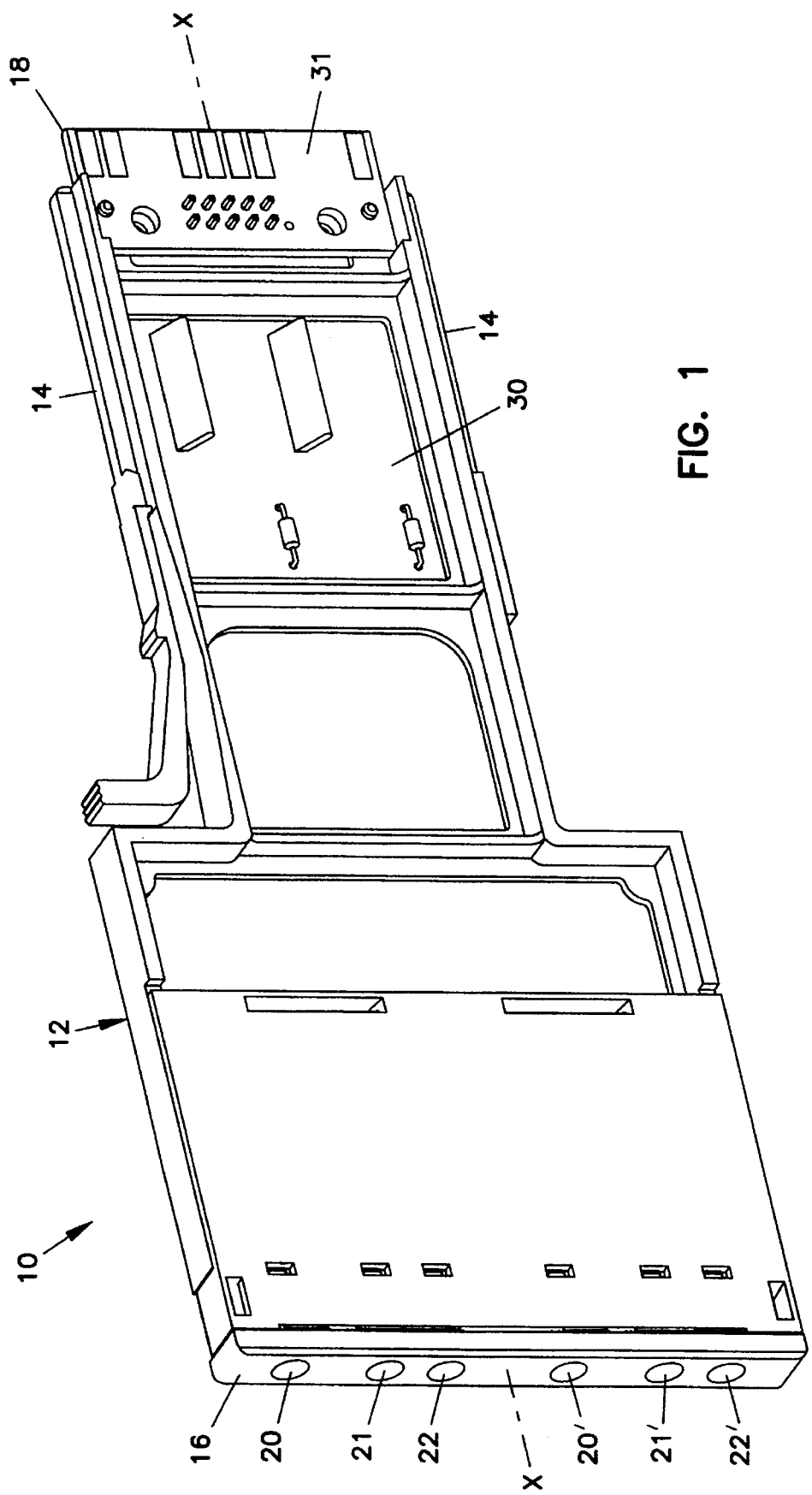
FIG. 1 is a front, right side and top perspective view of a drop and insert card of the present invention.

Referring now to the several drawing figures in which identical elements are numbered identically throughout, a description of the preferred embodiment of the present invention will now be provided.

The present invention is intended for use in an apparatus such as apparatus 10 shown in U.S. Pat. No. 5,199,878. The '878 patent and its teachings and drawings are incorporated herein by reference. Specifically, the present invention is intended to be used in lieu of any one of the jack cards 14 of the '878 patent. The present invention is a card for insertion into the chassis 16 of the '878 patent. Throughout this specification, reference will be made to the '878 patent and the reference numerals to those elements of that patent will be made with reference to the drawing figures and reference numerals in the '878 patent.

Figure 2:
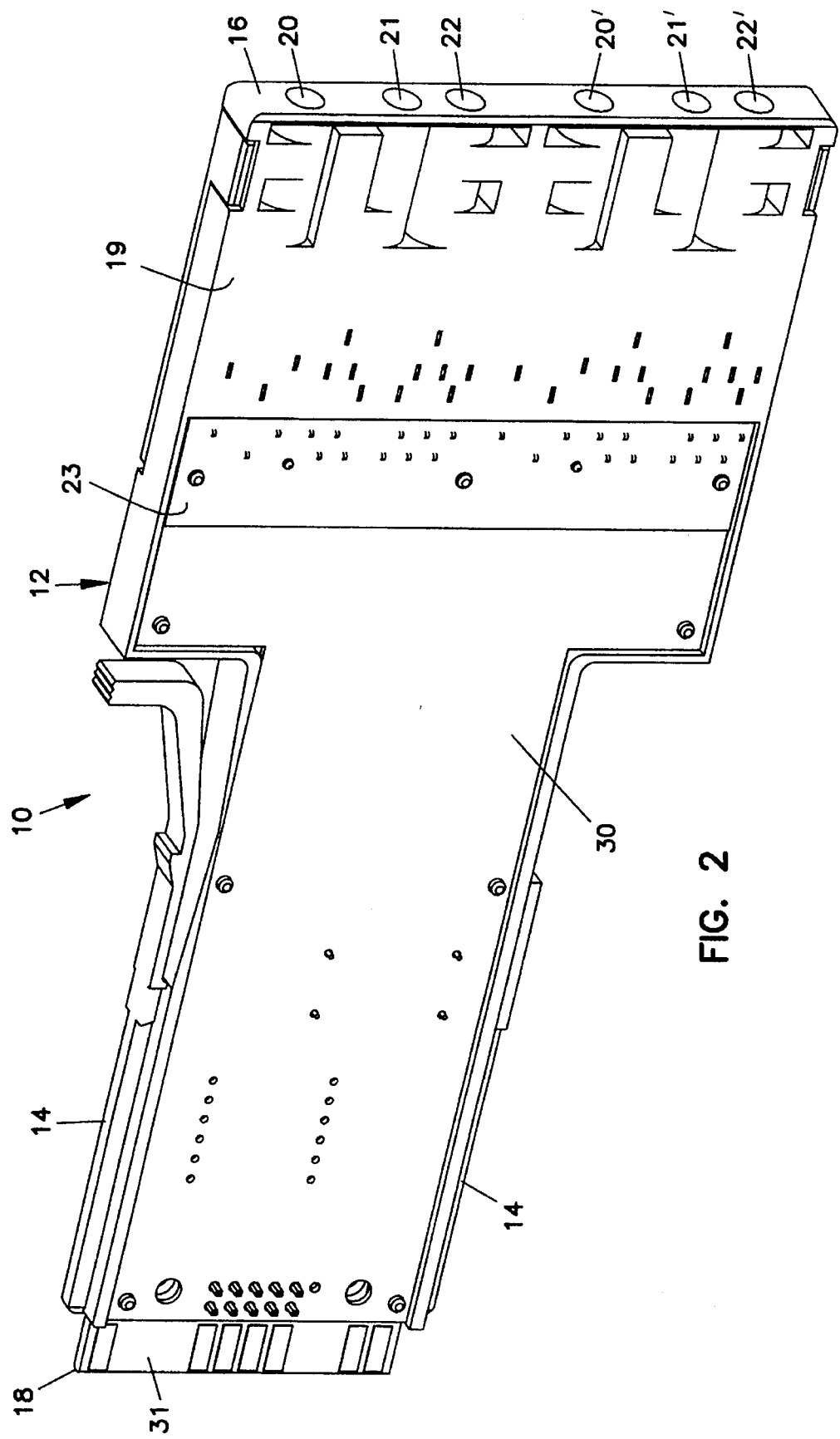
FIG. 2 is a front, left side and top perspective view of the card of FIG. 1.
Figure 3:
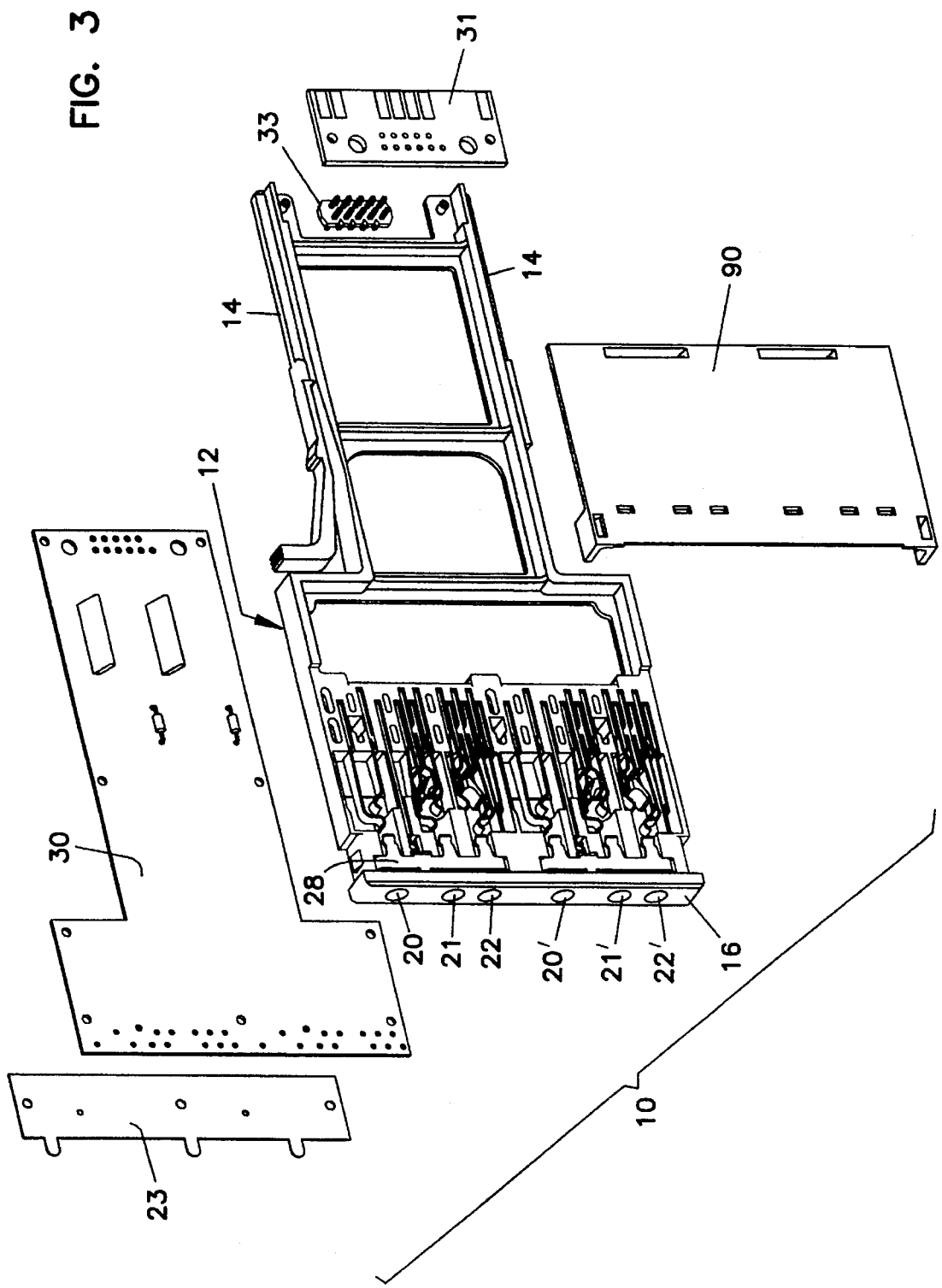
FIG. 3 is an exploded perspective view of the card of FIG. 1.

With initial reference to FIGS. 1–3 of the present application, a test and access card 10 according to the present invention is shown. The card 10 includes a dielectric frame 12 having top and bottom rails 14 sized and positioned to be slidably received within slots of a chassis such as slots 66 in chassis 12 as shown in the '878 patent.

Each of the cards 12 has a thickness identical to that of the module 14 of the aforesaid '878 patent such that a module 14 of the '878 patent can be replaced with a card 10 of the present invention. Therefore, a plurality of cards 10 can be disposed in side-by-side relation or a card 10 may be disposed in side-by-side relation with a module 14 of the '878 patent.

The card 10 of the present invention includes a front wall 16 and a rear end 18. The front wall 16 is provided with a plurality of ports sized to receive a jack plug (not shown). The plurality of ports includes a first set of ports (referred to as the "network" ports) comprising a first monitor port 20, a first OUT port 21 and a first IN port 22. A second set of ports (referred to as the "DCS" ports) includes a second monitor port 20', a second OUT port 21' and a second IN port 22'. The two sets of ports are arranged on opposite sides of the longitudinal axis X—X (FIG. 1) of the card 10.

Figure 5:
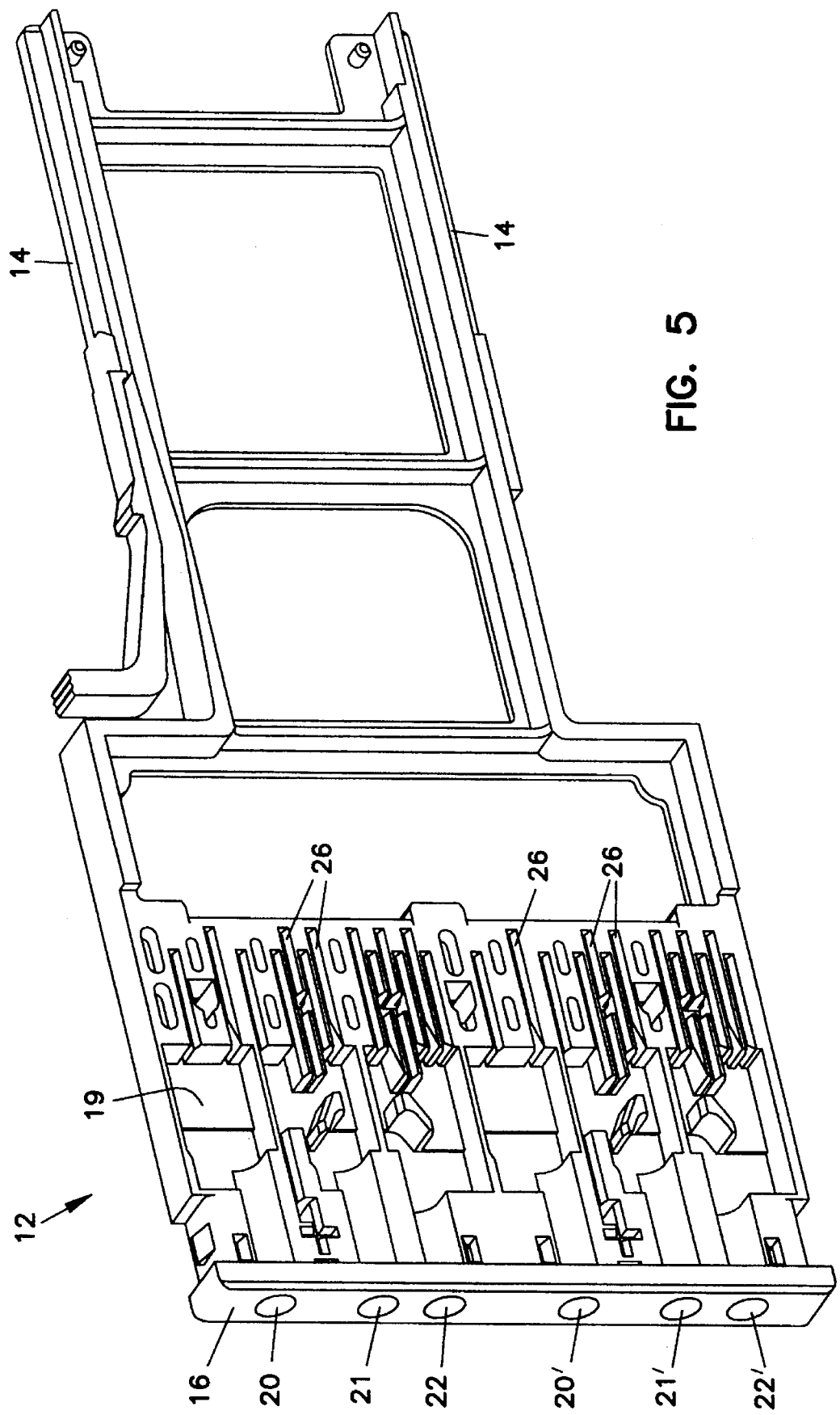
FIG. 5 is a front, top and right side perspective view of a frame for the card of FIG. 1.

The frame 12 is injection molded plastic and is provided with a plurality of slots 26 formed in a sidewall 19 (see FIG. 5) for holding individual ones of a plurality of electrically conductive jack springs. In order to cover and protect the springs, a snap-on dielectric cover 90 (shown in FIG. 3) is provided.

Figure 6:
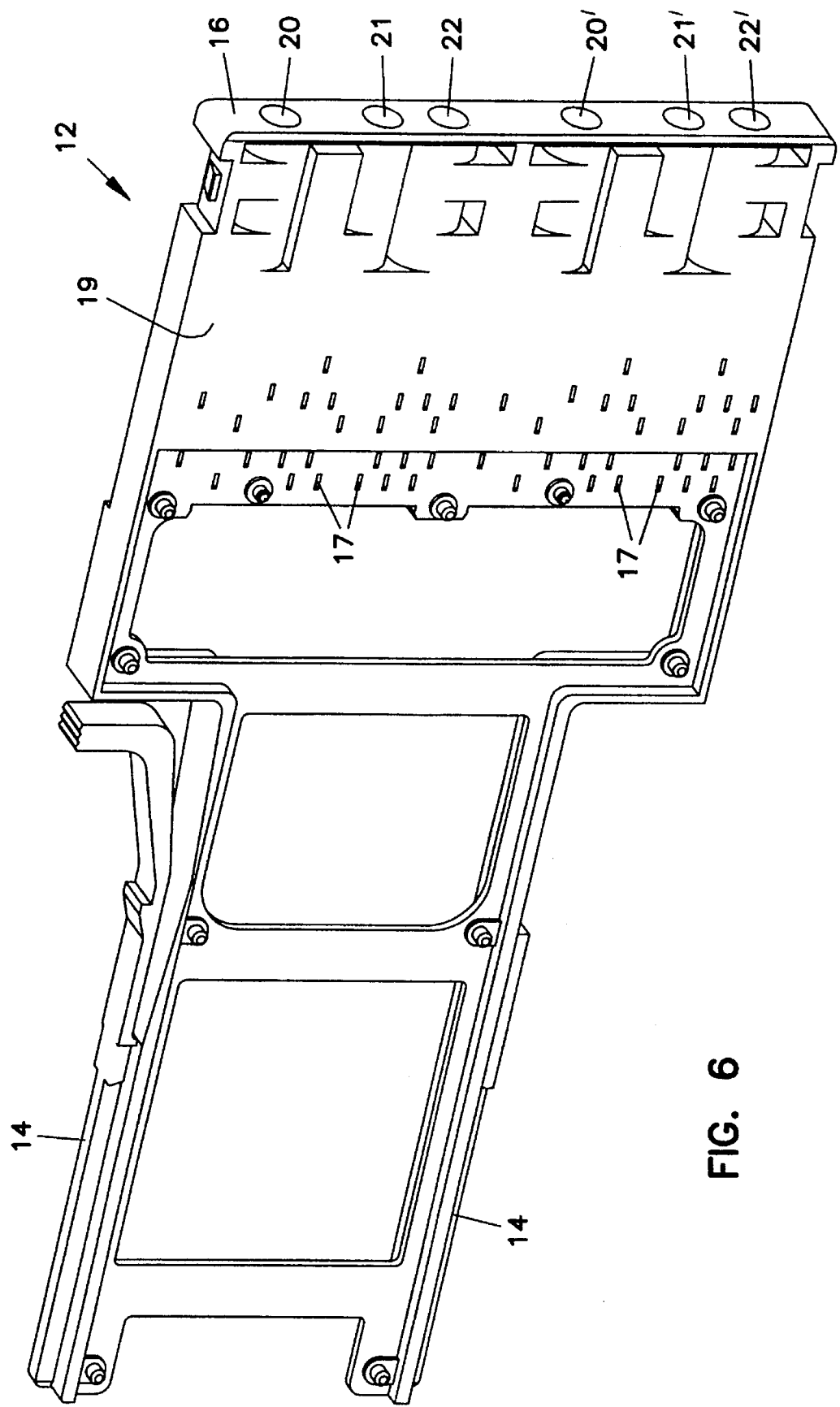
FIG. 6 is a front, top and left side perspective view of the frame of FIG. 5.

The plurality of jack springs includes a ground spring 28 positioned to electrically engage the collar of a jack plug inserted into either of ports 20–22, 20'–22' in order to ground the collar. Each of the springs has a contact end which protrudes through holes 17 (FIG. 6) in sidewall 19 and is electrically connected to the circuit of a printed circuit board 30. A dielectric plate 23 covers and protects the solder connections to the printed circuit board 30.

At the rear end 18 of the module the printed circuit board 30 has a second printed circuit board 31 connected thereto by a pin connector 33 (shown most clearly in FIG. 3). The second printed circuit board 31 has a plurality of exposed contacts.

The plurality of exposed contacts on second printed circuit board 31 includes a first (or "network") set 39 and a second (or "DCS") set 37. The contacts of the first and second sets 37,39 include a first and second tip OUT contacts 40,40', first and second tip IN contacts 41,41', respectively, first and second ring OUT contacts 42,42', respectively, and first and second ring IN contacts 43,43', respectively. As shown, the contacts 40–43, 40'–43' are arranged around longitudinal axis X—X.

Contacts 40 and 42 are the tip and ring contacts which may, using conventional terminology, be referred to as the network OUT contacts. Contacts 41 and 43 are the tip and ring contacts which may conventionally be referred to as the network IN contacts. Contacts 40' and 42' are tip and ring contacts which may conventionally be referred to as the DCS OUT contacts and contacts 41' and 43' are tip and ring contacts which may conventionally be referred to as the DCS IN contacts. The plurality of contacts also include ground contacts 50 on both sides of second printed circuit board 31 which are connected along the circuit path on the PC board to the ground spring 28.

Although not necessary, in one embodiment, the contact pairs are symmetrically arranged about axis X—X such that rotation of the card 10 about its axis X—X can permit insertion of the card 10 into the chassis of the '878 patent at any one of two orientations similar to the insertion of card 14 of the '878 patent in any one of two orientations as illustrated in FIGS. 18 and 19 of the '878 patent.

As mentioned, each of the slots 26 contains individual ones of the plurality of spring contacts.

Figure 4:
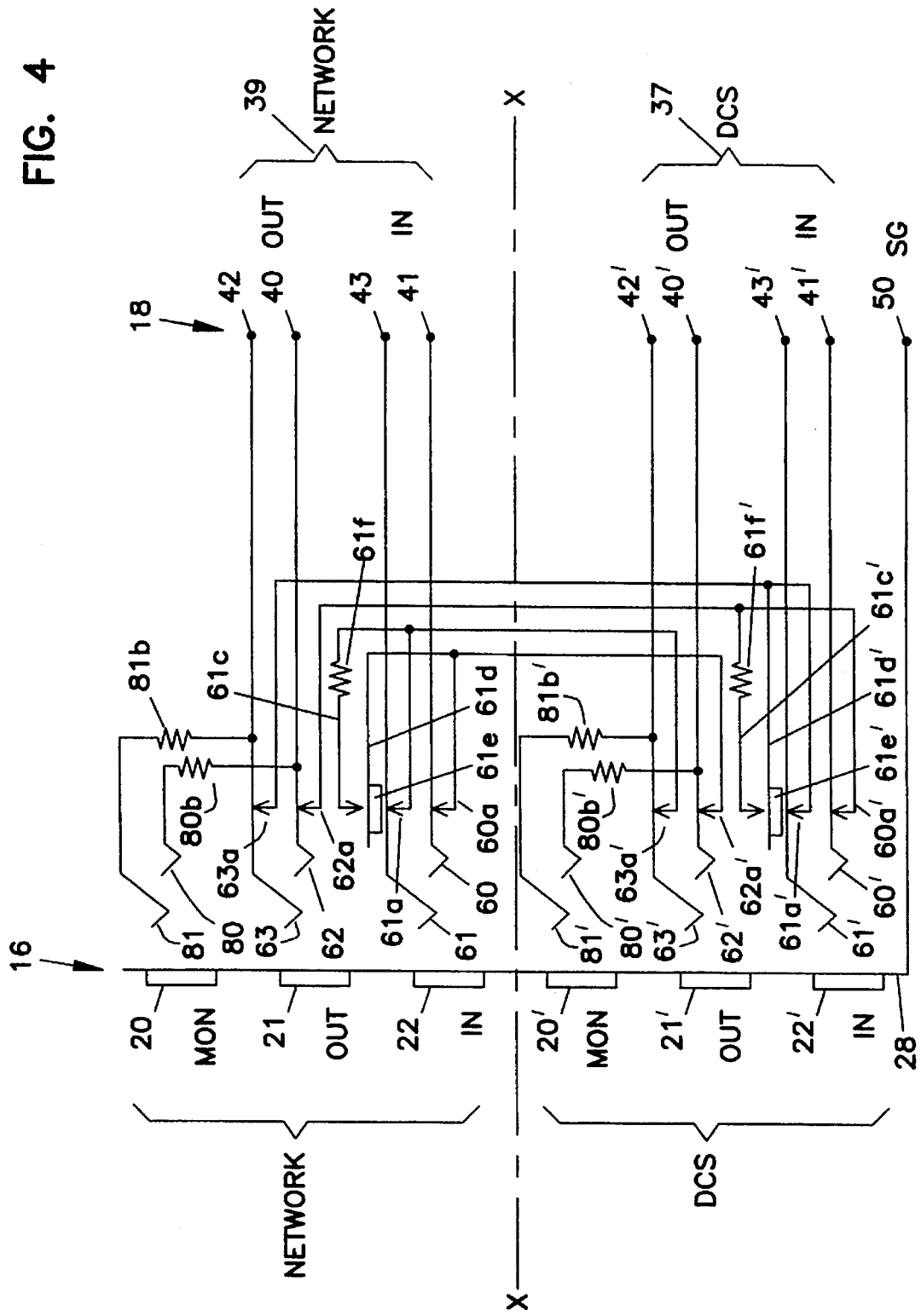
FIG. 4 is an electrical schematic of the card of FIG. 1.

While the spring contacts are shown in FIG. 3, they are numbered only in FIG. 4 for purpose of clarity. The plurality of spring contacts includes first and second tip IN spring contacts 60,60', respectively, first and second ring IN springs 61,61', first and second tip OUT springs 62,62', first and second ring OUT contacts 63,63', first and second tip IN normal springs 60a,60a', first and second ring IN normal springs 61a,61a', first and second tip OUT normal springs 62a,62a' and first and second ring OUT normal springs 63a,63a' Shown most clearly in schematic in FIG. 4 tip and ring spring pairs 62,63; 60,61; 62',63' and 60',61' are positioned and aligned to electrically engage the tip and ring contact surfaces, respectively, of a jack plug inserted into ports 21,22,21',22', respectively.

Each of the tip and ring contacts 60–63 and 60'–63' are associated with the individual ones of the normal spring contacts 60a–63a and 60a'–63a'. The normal spring contacts are biased to be in normal electrical communication with their associated spring contacts in the absence of a jack plug inserted within a port. Upon insertion of a jack plug within the port, the jack plug urges the tip and ring contacts away from the tip and ring normal contacts.

The plurality of spring contacts further include tip and ring springs 80,81 positioned to engage a plug inserted within monitor port 20 and tip and ring springs 80',81' positioned to engage a plug inserted within monitor port 20'.

Monitor tip spring 80 is electrically connected to OUT tip spring 62 across resistor 80b. Monitor ring spring 81 is electrically connected to OUT ring spring 63 across resister 81b. Similarly, spring 80' is electrically connected to spring 62' across resistor 80b' and spring 81' is electrically connected to spring 63' across resistor 81b' As a result, insertion of a jack plug into monitor port 20 permits a signal on the Out springs 62,63 to be monitored without interruption of the signal. Similarly, insertion of a plug into monitor port 20' permits a signal on OUT springs 62',63' to be monitored without interruption of the signal.

For a 100 ohm system, a first normally open spring 61c is spaced from a first contact spring 61d. Contact spring 61d is provided with a dielectric cam 61e such that insertion of a plug in first IN port 22 causes first IN ring spring 61 to urge against cam 61e and force first contact spring 61d into electrical contact with first normally open spring 61c. Similarly, a second normally open spring 61c' is spaced from a second contact spring 61d' having a dielectric cam 61e' opposing spring 61' Each of springs 61c,61c' are connected to normal springs 63a',62a across 100 ohm resistors 61f,61f', respectively. Springs 61c and 61a are connected to spring 63a'. Springs 61c' and 60a' are connected to spring 62a. Springs 61d and 60a are connected to spring 62a'. Springs 61d' and 61a' are connected to spring 63a.

It will be appreciated the ohm rating of resistors 61f,61f' is given for purpose example. The ohm rating may be varied to achieve a desired impedance.

The printed circuit board includes a plurality of circuit paths (shown schematically in FIG. 4) connecting individual pairs of the spring contacts and the contacts on the edge connector 31. Specifically, the circuit paths connect the contact and spring pairs 62,40; 63,42; 60,41; 61,43; 63',42'; 62',40'; 60',41'; and 61',43'.

In the present invention, the normal spring contacts 60a–63a of the first set are electrically connected with individual ones of the normal spring contacts 60a'–63a' of the second set. Specifically, the tip and ring normal OUT contacts 62a,63a are electrically connected with the tip and ring normal IN contacts 60a',61a' respectively. The tip and ring normal IN contacts 60a,61a are in electrical connection with the tip and ring normal OUT contacts 62a' and 63a' respectively.

Insertion of a plug in the Network IN port 22, connects the plug with the contacts 41,43. Further, such insertion urges contact 61d against contact 61c resulting in the DCS OUT line (at contacts 40',42') being presented with the 100 ohm impedance. Similarly, insertion of a plug in the DCS IN port 22' connects the plug with the contacts 41',43'. Such insertion urges contact 61d' against spring 61c' resulting in the Network OUT line (at contacts 40,42) being presented with a 100 ohm impedance.

With the structure thus described, the card 10 may be inserted within the chassis of the prior art chassis of the '878 patent.

Figure 7:
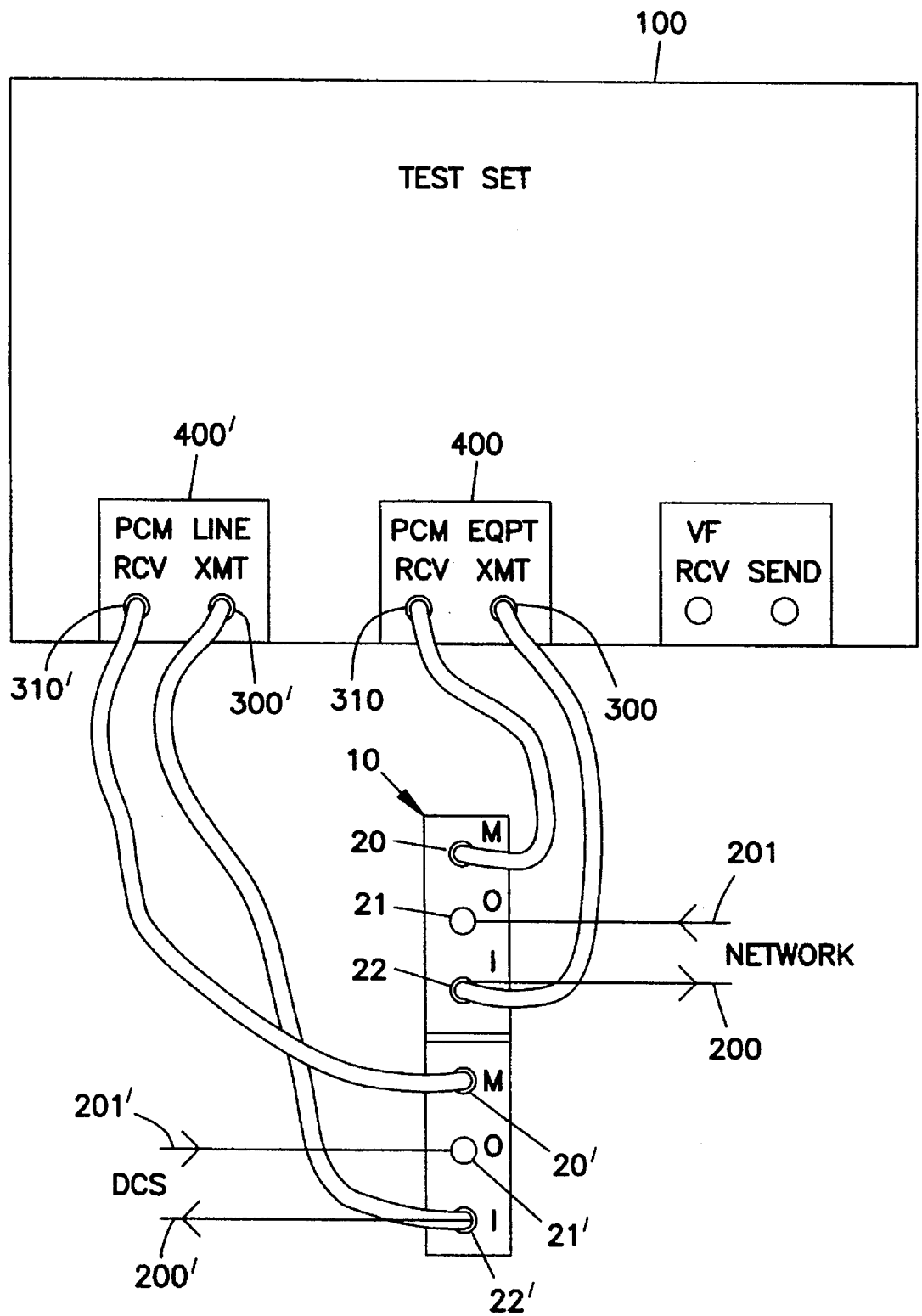
FIG. 7 is a schematic view of the card of the present invention in use.

With the structure thus described and with the card inserted within the chassis of the '878 patent, the card 10 permits a variety of task and maintenance functions in both the network and DCS sides of a circuit simultaneously. By way of illustration, FIG. 7 shows a card in use with a test set 100 (e.g., well-known PCM equipment). The network (,i.e.), IN and OUT lines 200, 201 (represented by single lines but, in fact, twisted pair lines each containing a tip and ring line) are connected to the OUT and IN contacts 40–43 on the rear of the card 10. Similarly, the IN and OUT lines 200', 201' of the DCS line are connected to the IN and OUT contacts 40'–43' associated with the second set of ports. The first monitor port 20 is connected to the receive side 310 of test set 100 and a jack plug is inserted into the input port 22 to connect it to the transmit side 300 of the network side 400 of the test set. The monitor port 20' of the second set of ports is connected to the receive side 300' of the line side 400' of test set 100 and the input port 22' of the second set is connected to the transmit side 310' of the PCM line. With the structure in use thus described, the card 10 has the advantage of full duplex testing, traffic monitoring, performance monitoring and other tests which may be desired. This permits electronic switching from the network to DCS sides without patching and without wasted time. Further, tests in both directions (i.e. to both the network and DCS sides) can be run on a single card simultaneously. Also, with use of printed circuit board 30, circuit enhancement functions (for example, repeaters or amplifiers) can be placed on the card.

Having described the foregoing invention and preferred embodiment, it has been shown how the objects of the invention have been attained in a preferred embodiment. However, modifications of the disclosed concepts which readily occur to one skilled in the art are intended to be included within the scope of the claims of the present invention.

What is claimed is:

1. A module for insertion into a telecommunications equipment chassis wherein said module comprises:

A. a frame sized to be removably inserted into said chassis;

B. a plurality of ports on a front end of said frame with each sized to receive a jack plug having a tip and a ring contact surface;

C. a plurality of exposed contacts on a rear end of said frame, said plurality including a first and second tip out-contact (40,40'), a first and a second ring out-contact (42,42'), a first and a second tip in-contact (41,41') and a first and a second ring in-contact (43,43');

D. said plurality of ports including a first and a second out-port (21,21'), and a first and a second in-port (22,22');

E. a plurality of spring contacts carried on said frame and including:

(a) first and second tip in-springs (60,60') disposed to electrically engage a tip contact surface of a jack plug inserted into either of said first and second in-ports (22,22'), respectively;

(b) first and second ring in-springs (61,61') disposed to electrically engage a ring contact surface of a jack plug inserted into either of said first and second in-ports (22,22'), respectively;

(c) first and second tip out-springs (62,62') disposed to electrically engage a tip contact surface of a jack plug inserted into either of said first and second out-ports (21,21'), respectively;

(d) first and second ring out-springs (63,63') disposed to electrically engage a ring contact surface of a jack plug inserted into either of said first and second out-ports (21,21'), respectively;

(e) first and second tip in-normal-springs (60a,60a') and first and second ring in-normal-springs (61a, 61a') disposed and biased to electrically contact with said first and second tip in-springs (60,60') and said first and second ring out-springs (61,61'), respectively, and said electrical contacts opened upon insertion of a plug into said first and second, respective, in-ports (22,22');

F. first and second tip out-normal-springs (62a,62a') and first and second ring out-normal-springs (63a,63a') disposed and biased to electrically contact with first and second tip in-springs (62,62') and first and second ring out-springs (63,63'), respectively, and said electrical contact opened upon insertion of a plug into said first and second, respective, out-ports (21,21');

G. a plurality of circuit paths including:

(a) first and second tip out circuit paths connecting said first and second, respective, tip out-springs (62,62') with said first and second, respective, tip out-contacts (40,40');

(b) first and second ring out circuit paths connecting said first and second, respective, ring out-springs (63,63') with said first and second, respective, ring out-contacts (42,42');

(c) first and second tip in circuit paths connecting said first and second, respective, tip in-springs (60,60') with said first and second, respective, tip in-contacts (41,41');

(d) first and second ring in circuit paths connecting said first and second, respective, ring in-springs (61,61') with said first and second, respective, ring in-contacts (43,43');

(e) a first normal path electrically connecting said first tip out-normal-spring (62a) directly to with said second tip in-normal-spring (60a');

(f) a second normal path electrically connecting said first ring out-normal-spring (63a) directly to said second ring in-normal-spring (61a');

(g) third normal path electrically connecting said first tip in-normal-spring (60a) directly to said second tip-out-normal spring (62a');

(h) a fourth normal path electrically connecting said first ring in-normal-spring (61a) directly to said second ring out-normal-spring (63a').

2. A module according to claim 1 comprising first and second monitor ports disposed on said first end and sized to receive a jack plug, first and second monitor ring springs and first and second monitor tip springs associated with said first and second monitor ports, respectively, for electrical connection upon insertion of a plug;

said monitor tip and ring springs connected to said out tip and ring springs across a circuit for permitting access to a signal on said tip and ring springs without interruption of said signal.

3. A module according to claim 1 wherein said first and second contacts are disposed on said rear end symmetrically about a longitudinal axis of said card.

4. A module according to claim 1 comprising a first terminating spring (61c) disposed to electrically engage a second terminating spring (61d) upon insertion of a plug into said first in-port (22), said first terminating spring (61c) connected to said second ring out-normal-spring (63a'), said second terminating spring (61d) connected to said second tip out-normal-spring (62a'), at least one of said first and second terminating springs (61c,61d) including a terminating resistor (61f).

5. A module according to claim 1 comprising a third terminating spring (61c') disposed to electrically engage a fourth terminating spring (61d') upon insertion of a plug into said second in-port (22'), said third terminating spring (61c') connected to said first tip out-normal-spring (62a), said fourth terminating spring (61d') connected to said first ring out-normal-spring (63a), at least one of said third and fourth terminating springs (61c',61d') including a terminating resistor (61f').

6. A module for insertion into a telecommunications equipment chassis wherein said module comprises:

a body having a front end with a first plurality of ports and a second plurality of ports each sized to receive a jack plug;

each of said ports having associated therewith a tip spring, a ring spring, a tip normal spring and a ring normal spring;

said tip and ring springs disposed to engage a tip and ring surface, respectively, of a jack plug inserted into said ports, said tip normal spring and ring normal spring in normally closed electrical contact with said tip and ring springs, respectively, and said electrical contact opened upon insertion of said plug;

a first and a second plurality of contacts each individually electrically connected to said tip and ring springs of said first and second plurality of ports;

said tip normal springs of said first plurality of ports electrically connected directly to individual ones of said tip normal springs of said second plurality of ports;

said ring normal springs of said first plurality of ports electrically connected directly to individual ones of said ring normal springs of said second plurality of ports.

7. A module according to claim 1 wherein said plurality of exposed contacts are disposed on an edge of a printed circuit board.

8. A module according to claim 6 comprising a printed circuit board extending from said front end to a rear end of said body; said tip and ring springs connected to said front end and said contacts connected to said rear end and electrically connected to said springs across a circuit path on said board.

9. A module according to claim 6 comprising circuit enhancement circuitry on said board along said path.

* * * * *